US009252345B2

(12) United States Patent
Cho et al.

(10) Patent No.: US 9,252,345 B2
(45) Date of Patent: Feb. 2, 2016

(54) LIGHT EMITTING DEVICE AND LIGHTING SYSTEM

(71) Applicant: LG INNOTEK CO., LTD., Seoul (KR)

(72) Inventors: Hyun Kyong Cho, Seoul (KR); Ho Ki Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1 day.

(21) Appl. No.: 14/203,026

(22) Filed: Mar. 10, 2014

(65) Prior Publication Data

US 2014/0191279 A1 Jul. 10, 2014

Related U.S. Application Data

(63) Continuation of application No. 13/179,192, filed on Jul. 8, 2011, now Pat. No. 8,698,176.

(30) Foreign Application Priority Data

Jul. 12, 2010 (KR) ........................ 10-2010-0067115

(51) Int. Cl.
*H01L 33/38* (2010.01)
*H01L 33/62* (2010.01)
*H01L 33/22* (2010.01)
*F21K 99/00* (2010.01)

(52) U.S. Cl.
CPC ................ *H01L 33/62* (2013.01); *H01L 33/22* (2013.01); *H01L 33/382* (2013.01); *F21K 9/00* (2013.01); *H01L 2224/48091* (2013.01); *H01L 2224/48247* (2013.01); *H01L 2933/0016* (2013.01)

(58) Field of Classification Search
CPC ....... H01L 33/22; H01L 33/382; H01L 33/20; F21K 9/00

USPC ...................... 438/29, 34, 22; 257/79, 94, 98, 257/E21.499, E33.001
See application file for complete search history.

(56) References Cited

U.S. PATENT DOCUMENTS

| | | | |
|---|---|---|---|
| 6,914,268 B2 | 7/2005 | Shei et al. | |
| 7,842,958 B1 | 11/2010 | Sekine et al. | |
| 7,964,881 B2 | 6/2011 | Choi et al. | |
| 2006/0273333 A1 | 12/2006 | Wu et al. | |
| 2009/0095973 A1 | 4/2009 | Tanaka et al. | |
| 2012/0018764 A1 | 1/2012 | Choi et al. | |
| 2012/0168809 A1 | 7/2012 | Maute et al. | |

FOREIGN PATENT DOCUMENTS

| | | |
|---|---|---|
| DE | 10 2008 034 705 A1 | 2/2010 |
| JP | 4230219 B2 | 12/2008 |
| JP | 4454589 B1 | 4/2010 |
| KR | 10-2009-0010623 A | 1/2009 |
| KR | 10-2010-0017365 A | 2/2010 |
| KR | 10-2010-0054756 A | 5/2010 |
| WO | WO 2010/139567 A2 | 12/2010 |

*Primary Examiner* — David Vu
(74) *Attorney, Agent, or Firm* — Birch, Stewart, Kolasch & Birch, LLP

(57) ABSTRACT

A light emitting device includes a conductive support member, a first conductive layer disposed on the conductive support member, a second conductive layer disposed on the first conductive layer, a light emitting structure including a first semiconductor layer, a second semiconductor layer, and an active layer disposed between the first semiconductor layer and the second semiconductor layer, and an insulation layer disposed between the first conductive layer and the second conductive layer. The first conductive layer includes a first expansion part penetrating through the second conductive layer, the second semiconductor layer and the active layer, and includes a second expansion part extending from the first expansion part and being disposed in the first semiconductor layer. The insulation layer is disposed on the lateral surface of the first expansion part, and wherein the lateral surface of the second expansion part contacts with the first semiconductor layer.

20 Claims, 9 Drawing Sheets

LIGHT EMITTING DEVICE AND LIGHTING SYSTEM

CROSS-REFERENCE TO RELATED APPLICATIONS

This application is a Continuation Application of U.S. application Ser. No. 13/179,192 filed Jul. 8, 2011, which claims priority from Korean Application No. 10-2010-0067115, filed Jul. 12, 2010, the subject matters of which are incorporated herein by reference.

TECHNICAL FIELD

The present disclosure relates to a light emitting device and a lighting system.

BACKGROUND

A light emitting diode (LED) is a semiconductor element for converting electric energy into light. As compared with existing light sources such as a fluorescent lamp and an incandescent electric lamp and so on, the LED has advantages of low power consumption, a semi-permanent span of life, a rapid response speed, safety and an environment-friendliness. For this reason, many researches are devoted to substitution of the existing light sources with the LED. The LED is now increasingly used as a light source for lighting devices, for example, various lamps used interiorly and exteriorly, a liquid crystal display device, an electric sign and a street lamp and the like.

SUMMARY

One embodiment is a light emitting device. The light emitting device comprises: a conductive support member; a first conductive layer disposed on the conductive support member; a second conductive layer disposed on the first conductive layer; a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and an insulation layer comprising a first insulation layer and a second insulation layer, wherein the first conductive layer comprises: a conductive part disposed on the conductive supporting member; a first expansion part extending from the conductive part and penetrating through the second conductive layer, the second semiconductor layer and the active layer; and a second expansion part extending from the first expansion part and being disposed in the first semiconductor layer, wherein first expansion part is disposed between the conductive part and second expansion part, wherein the first insulation layer is disposed on the lateral surface of the first expansion part, wherein the second insulation layer is disposed between the first conductive layer and the second conductive layer, and wherein an area of a bottom surface of the second expansion part is greater than an area of a top surface of the first expansion part.

Another embodiment is a light emitting device. The light emitting device comprises: a conductive support member; a first conductive layer disposed on the conductive support member; a second conductive layer disposed on the first conductive layer; a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and an insulation layer comprising a first insulation layer and a second insulation layer, wherein the first conductive layer comprises: a conductive part disposed on the conductive supporting member; a first expansion part extending from the conductive part and penetrating through the second conductive layer, the second semiconductor layer and the active layer; and a second expansion part extending from the first expansion part and being disposed in the first semiconductor layer, wherein the first insulation layer is disposed on the lateral surface of the first expansion part, wherein the second insulation layer is disposed between the first conductive layer and the second conductive layer, and wherein a width of the second expansion part is greater than a width of the first expansion part.

Further another embodiment is a light emitting device. The light emitting device comprises: a conductive support member; a first conductive layer disposed on the conductive support member; a second conductive layer disposed on the first conductive layer; a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and an insulation layer comprising a first insulation layer and a second insulation layer, wherein the first conductive layer comprises: a conductive part disposed on the conductive supporting member; a first expansion part extending from the conductive part and penetrating through the second conductive layer, the second semiconductor layer and the active layer; and a second expansion part extending from the first expansion part and being disposed in the first semiconductor layer, wherein the first insulation layer is contact with the first expansion part, the second expansion part and the active layer, and wherein the second insulation layer is disposed between the conductive part and the second conductive layer.

DETAILED DESCRIPTION OF THE EMBODIMENTS

Figure 1:
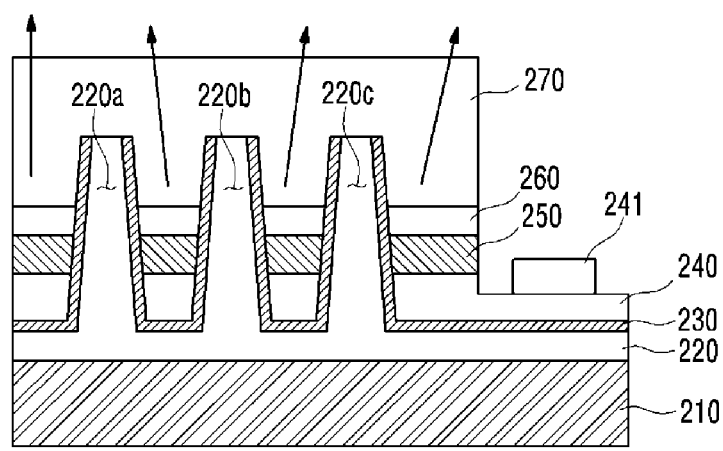
FIG. 1 is a view showing a cross section of a light emitting device according to an embodiment of the present disclosure.

In the drawings, a thickness or size of each layer may be magnified, omitted or schematically shown, simply for purpose of convenience and clarity of description. The size of each component may not necessarily represent its actual size.

Further, when an element is referred to as being 'on' or "under" another element, it may be directly on/under the element, or one or more intervening elements may also be present. When an element is referred to as being 'on' or 'under', 'under the element' as well as 'on the element' may be included based on the element.

Hereinafter, an embodiment of the present disclosure will be described in detail with reference to the accompanying drawings.

[Light Emitting Device]

FIG. 1 is a view showing a cross section of a vertical light emitting device 200 including a via hole electrode in accordance with an embodiment.

Hereafter, for the sake of convenience of description, it is assumed that a semiconductor layer 270 electrically connected to an n-type conductive layer 220 through conductive vias 220a, 220b and 220c is an n-type semiconductor layer, and a semiconductor layer 250 formed between a p-type conductive layer 240 and an active layer 260 is a p-type semiconductor layer.

In the light emitting device shown in FIG. 1, the conductive vias 220a, 220b and 220c are formed to penetrate through the p-type conductive layer 240, the p-type semiconductor layer 250 and the active layer 260 from the n-type conductive layer 220, and extend to a certain area of the n-type semiconductor layer 270. The structure of the light emitting device 200 shown in FIG. 1 provides excellent light-extraction efficiency because the top surface of the n-type semiconductor layer 270 actually emitting light is not blocked by an electrode.

A p-type electrode pad 241 is disposed on the p-type conductive layer 240.

An insulation layer 230 electrically insulates the n-type conductive layer 220 from layers other than the conductive support member 210 and the n-type semiconductor layer 270.

Figure 2A:
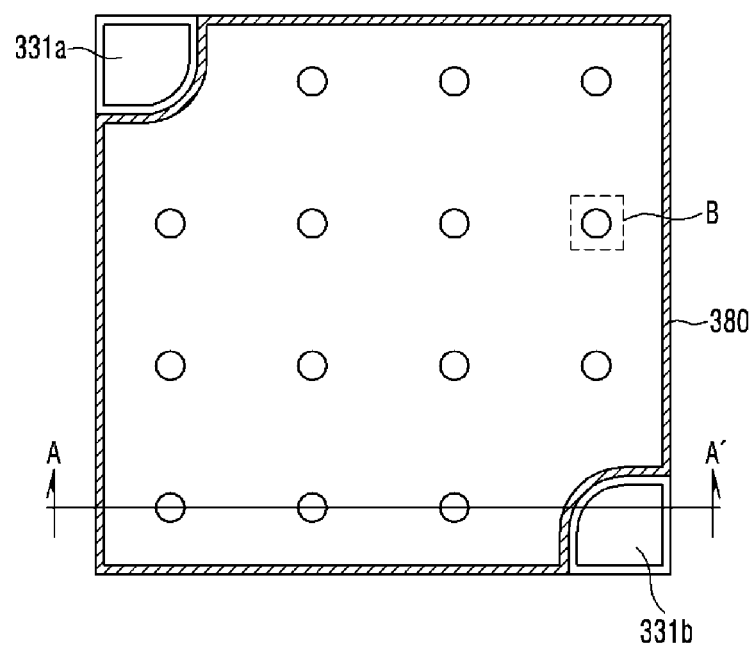
FIG. 2A is a view showing a top surface of the light emitting device according to the embodiment of the present disclosure.
Figure 2B:
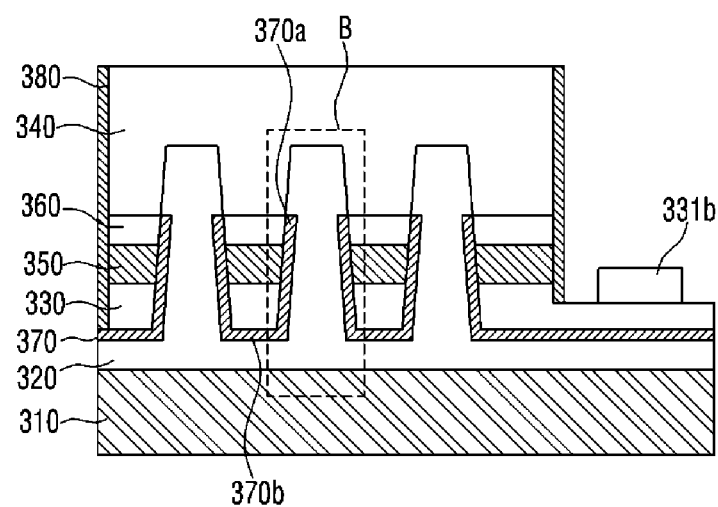
FIG. 2B is a view showing a cross section of the light emitting device taken along line A-A' of FIG. 2A.
Figure 2C:
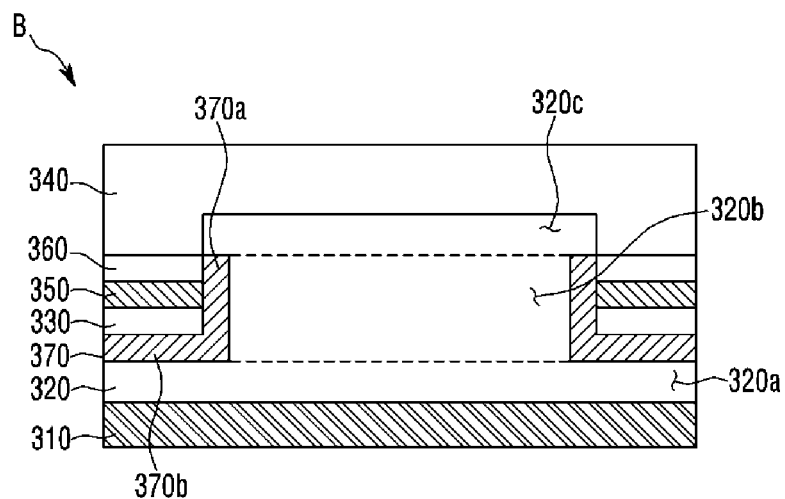
FIG. 2C is a view showing in detail the area 'B' of FIG. 2B.

FIG. 2A is a view showing a top surface of a light emitting device 300 according to another embodiment. FIG. 2B is a view showing a cross section of the light emitting device 300 taken along line A-A' of FIG. 2A. FIG. 2C is an enlarged view showing the area 'B' of FIG. 2B.

Referring to FIGS. 2A to 2C, a light emitting device 300 according to another embodiment includes a conductive support member 310, a first conductive layer 320, a second conductive layer 330, a light emitting structure 340, 350 and 360, and an insulation layer 370. Here, for the sake of convenience of description, it is assumed that the first conductive layer 320 is an n-type conductive layer, the second conductive layer 330 is a p-type conductive layer, the first semiconductor layer 340 is an n-type semiconductor layer, and the second semiconductor layer 350 is a p-type semiconductor layer.

The conductive support member 310 is formed including at least one of Au, Ni, Al, Cu, W, Si, Se, Mo and GaAs. For example, the conductive support member 310 is made of a metal alloy of Si and Al.

The first conductive layer 320 includes at least one conductive via B and a conductive part 320a contacting with the conductive support member 310.

The area ratio of the bottom surface of the conductive via B shown in FIG. 2B to the top surface of the conductive via B is from 1 to 2.5. Here, the bottom surface of the conductive via B corresponds to a surface which comes in direct contact with the conductive part 320a. The top surface of the conductive via B corresponds to a surface which comes in direct contact with the first semiconductor layer 340.

The thickness of the conductive part 320a shown in FIG. 2C is equal to or larger than 0.7 µm and equal to or less than 2 µm, and more preferably is approximately 1 µm.

The conductive via B includes a first expansion part 320b and a second expansion part 320c, all of which are shown in FIG. 2C. Both the first expansion part 320b and the second conductive layer 330, the second semiconductor layer 350 and an active layer 360 are located in the same layer. The second expansion part 320c extends from the first expansion part 320b and is disposed at a certain area of the first semiconductor layer 340. The conductive part 320a, the first expansion part 320b and the second expansion part 320c allows the conductive support member 310 to be electrically connected to the first semiconductor layer 340.

The first conductive layer 320 is electrically directly connected to the first semiconductor layer 340 through the top surface and the lateral surface of the second expansion part 320c.

Since the conductive support member 310 is electrically connected to the first semiconductor layer 340 by the first conductive layer 320, the first conductive layer 320 is made of a material having a minimum contact resistance with the conductive support member 310 and the first semiconductor layer 340.

The first conductive layer 320 is formed including at least one of Ag, Al, Au, Pt, Ti, Cr, and W.

The insulation layer 370 electrically insulates the first conductive layer 320 from layers other than the conductive support member 310 and the first semiconductor layer 340.

Specifically, the insulation layer 370 includes a first insulation layer 370a and a second insulation layer 370b. The first insulation layer 370a is disposed on the lateral surface of the first expansion part 320b, and electrically insulates the second conductive layer 330 from the first expansion part 320b, the second semiconductor layer 350 from the first expansion part 320b, and the active layer 360 from the first expansion part 320b.

The second insulation layer 370b is disposed between the first conductive layer 320 and the second conductive layer 330, so that the first conductive layer 320 is electrically insulated from the second conductive layer 330.

The height of the first insulation layer 370a is less than that of the conductive via B. The height of the conductive via B is greater than that of the first insulation layer 370a to the contrary. Here, the height of the first insulation layer 370a corresponds to a height in the direction of the first semiconductor layer 340 on the basis of the top surface of the conductive part 320a. The height of the conductive via B corresponds to a height in the direction of the first semiconductor layer 340 on the basis of the top surface of the conductive part 320a. Here, it should be noted that the reference surface for the height includes not only the top surface of the conductive part 320a but also the bottom surface of the conductive part 320a and the top or bottom surface of the conductive support member 310.

The height of the first insulation layer 370a may be equal to that of the first expansion part 320b. Here, the height of the first expansion part 320b corresponds to a height in the direction of the first semiconductor layer 340 on the basis of the top surface of the conductive part 320a. Here, it should be noted that the reference surface for the height includes not only the top surface of the conductive part 320a but also the bottom surface of the conductive part 320a and the top or bottom surface of the conductive support member 310.

Meanwhile, though not shown, the height of the first insulation layer 370a may be greater than that of the first expansion part 320b. That is, the first insulation layer 370a may be disposed on a portion of the lateral surface of the second expansion part 320c.

The thickness of the first insulation layer 370a is equal to or larger than 200 nm and equal to or less than 1000 nm. When the first insulation layer 370a has a thickness within the range, the stability of the first insulation layer 370a is improved. More preferably, it is better to have a thickness of about 500 nm.

The area of the bottom surface of the second expansion part 320c is greater than that of the top surface of the first expansion part 320b. Here, the top surface of the first expansion part 320b contacts with the bottom surface of the second expansion part 320c. Here, the area ratio of the bottom surface of the second expansion part 320c to the top surface of the first expansion part 320b is from 1 to 1.4.

The width of the second expansion part 320c may be equal to or greater than that of the first expansion part 320b. Also, the width of the second expansion part 320c may be equal to or less than the sum of the width of the first expansion part 320b and the widths of two first insulation layers 370a. The width of the second expansion part 320c may be greater than the sum of the width of the first expansion part 320b and the thicknesses of two first insulation layers 370a.

The insulation layer 170 includes at least any one of silicon oxide ($SiO_2$), silicon nitride ($SiO_xN_y$, $Si_xN_y$), metal oxide ($Al_2O_3$) and fluoride based compound.

In the embodiment shown in FIGS. 2A to 2C, it is possible to increase the contact area between the first conductive layer 320 and the first semiconductor layer 340 by minimizing the insulation area between the second expansion part 320c and the first semiconductor layer 340.

The second conductive layer 330 is formed on the insulation layer 370. There is no second conductive layer 330 in the area through which the first expansion part 320b penetrates.

The second conductive layer 330 is formed including at least one of Ag, Al, Pt, Ni, Pt, Pd, Au, Ir and a transparent conductive oxide (ITO and GZO). This intends to minimize the contact resistance of the second semiconductor layer 350 because the second conductive layer 330 contacts electrically with the second semiconductor layer 350.

The second conductive layer 330 may include a reflective layer or an ohmic layer for reflecting light emitted from the active layer 360 in the direction of the active layer 360.

The second conductive layer 330 includes at least one area exposed outward. On the exposed area, p-type electrode pads 331a and 331b to which external electric power is applied are disposed. On the exposed area, the second semiconductor layer 350, the active layer 360 and the first semiconductor layer 340 are not disposed. The exposed area is, as shown in FIG. 2A, disposed at the corner of the light emitting device 300, and the p-type electrode pads 331a and 331b are disposed on the exposed area. When the p-type electrode pads 331a and 331b are disposed at the corner of the light emitting device 300, the light emitting area of the light emitting device 300 can be maximized.

The thickness of the second conductive layer 330 is equal to or larger 50 nm and equal to or less than 1000 nm.

The light emitting structure 340, 350 and 360 is disposed on the second conductive layer 330.

The light emitting structure 340, 350 and 360 includes the first semiconductor layer 340, the second semiconductor layer 350 and the active layer 360. Specifically, the second semiconductor layer 350 is disposed on the second conductive layer 330. The first semiconductor layer 340 is disposed on the second semiconductor layer 350. The active layer 360 is disposed between the first semiconductor layer 340 and the second semiconductor layer 350.

The first semiconductor layer 340 is formed of a semiconductor material having an empirical formula of $In_xAl_yGa_{1-x-y}N$ ($0\leq x\leq 1$, $0\leq y\leq 1$, $0\leq x+y\leq 1$), for example, InAlGaN, GaN, AlGaN, InGaN, AlInN, AlN and InN and the like. An n-type dopant such as Si, Ge and Sn and the like may be doped on the first semiconductor layer 340.

The second semiconductor layer 350 is formed of a semiconductor material having an empirical formula of $In_xAl_yGa_{1-x-y}N$ ($0\leq x\leq 1$, $0\leq y\leq 1$, $0\leq x+y\leq 1$), for example, InAlGaN, GaN, AlGaN, InGaN, AlInN, AlN and InN and the like. A p-type dopant such as Mg and Zn and the like may be doped on the second semiconductor layer 350.

The active layer 360 is formed of a semiconductor material having an empirical formula of $In_xAl_yGa_{1-x-y}N$ ($0\leq x\leq 1$, $0\leq y\leq 1$, $0\leq x+y\leq 1$). When the active layer 360 is formed in the multiple quantum well (MQW) structure, the active layer 360 is formed by stacking a plurality of well layers and a plurality of barrier layers, for example, at a cycle of InGaN well layer/GaN barrier layer.

The active layer 360 is formed of another material in accordance with the material constituting the first semiconductor layer 340 and the second semiconductor layer 350. In other words, the active layer 360 converts energy by the recombination of electrons and holes into light and emits. Therefore, it is recommended that the active layer 360 be formed of a material having an energy band gap smaller than those of the first semiconductor layer 340 and the second semiconductor layer 350.

Meanwhile, the active layer 360 exposed outward is able to function as a current leakage path during the working of the light emitting device 300. Here, such a problem is prevented by forming a passivation layer 380 on the side of the light emitting device 300. The passivation layer 380 protects the light emitting structure, especially the active layer 360 from the outside and prevents a leakage current from flowing. The passivation layer 380 is formed of silicon oxide ($SiO_2$), silicon nitride ($SiO_xN_y$, $Si_xN_y$) and fluoride based compound. Otherwise, the passivation layer 380 may be a composite layer constituted by the aforementioned materials.

Regarding the light emitting device 300 according to the embodiment shown in FIGS. 2A to 2C, when the first insulation layer 370a formed on the side of the conductive via B is minimized, the contact area between the first conductive layer 320 and the first semiconductor layer 340 can be more increased than that of the light emitting device shown in FIG. 1. When the contact area is increased, the electric current flow within the light emitting device 300 is activated, so that light output and light-extraction efficiency are increased. Therefore, there is an advantage of improving electrical characteristics.

In the light emitting device shown in FIG. 1, the greater the height of the conductive via 220a is, the more the side of the conductive via 220a is inclined. Therefore, the area of the top surface of the conductive via 220a electrically connected to the n-type semiconductor layer 270 is reduced. However, though the light emitting device according to the embodiment shown in FIGS. 2A to 2C includes a conductive via B the same as the conductive via 220a shown in FIG. 1, the light emitting device has an advantage of obtaining a contact area larger than that of the light emitting device shown in FIG. 1.

Figure 2D:
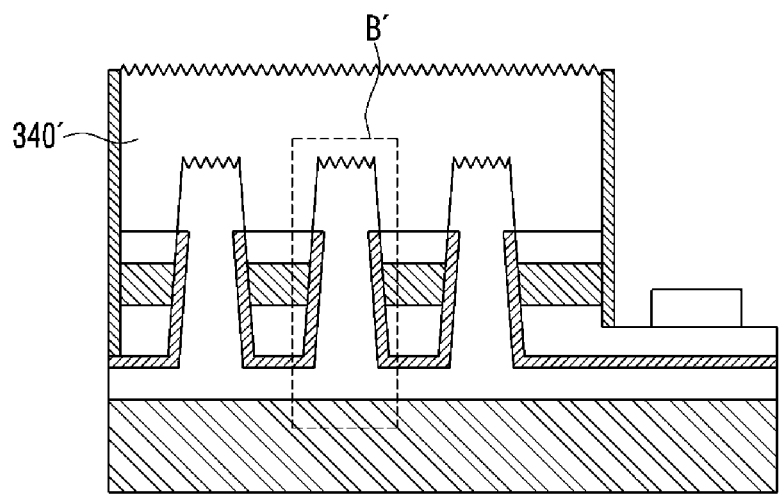
FIG. 2D is a view showing a cross section of another embodiment of the light emitting device shown in FIG. 2B.

FIG. 2D is a view showing a cross section of a light emitting device 300' according to another embodiment of the light emitting device 300 shown in FIG. 2B. The description of the same components as those of FIG. 2B will be omitted.

A conductive via B' of the light emitting device 300' according to another embodiment shown in FIG. 2D has a roughness surface. Specifically, The top surface of the conductive via B' contacting with the first semiconductor layer 340' has the roughness surface. When the top surface of the conductive via B' has the roughness surface, the contact resistance is reduced due to the surface area increase. Therefore, ohmic contact characteristics of the light emitting device 300' can be improved. Besides, the roughness of the surface changes the critical angle of light and allows the light to be easily extracted, so that the light-extraction efficiency of the light emitting device 300' can be improved. Here, the roughness surface has a cycle in a micro unit. However the cycle is not limited to this. The roughness can be ununiformly formed.

The first semiconductor layer 340' of the light emitting device 300' according to another embodiment has a roughness surface. Specifically, in the first semiconductor layer 340', the exposed top surface of and the ohmic contact surface contacting with the top surface of the conductive via B' have the roughness surface. When the top surface and the ohmic contact surface have the roughness surface, the contact resistance is reduced due to the surface area increase. Therefore, the ohmic contact characteristics of the light emitting device 300' can be improved. Besides, the roughness of the surface changes the critical angle of light and allows the light to be easily extracted, so that the light-extraction efficiency of the light emitting device 300' can be improved. Here, the roughness surface has a cycle in a micro unit. However the cycle is not limited to this. The roughness can be ununiformly formed.

[Method for Manufacturing the Light Emitting Device]

FIGS. 3A to 3K are views showing a method of manufacturing the light emitting device according to the embodiment.

Figure 3A:
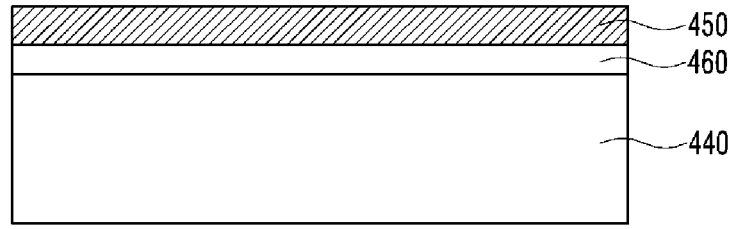
FIGS. 3A to 3K are views showing a method of manufacturing the light emitting device according to the embodiment of the present disclosure.

As shown in FIG. 3A, a first semiconductor layer 440, an active layer 460 and a second semiconductor layer 450, all of which are included in a light emitting structure, are sequentially formed.

First, the first semiconductor layer 440, the active layer 460 and the second semiconductor layer 450 are sequentially grown on a semiconductor growth substrate (not shown) by using a semiconductor growth process such as a metal organic chemical vapor deposition (MOCVD) or a molecular beam epitaxy (MBE) and a hydride vapour phase epitaxy (HYPE), etc.

The first semiconductor layer 440 is formed by doping an n-type dopant such as Si, Ge and Sn and the like into a semiconductor material having an empirical formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN and InN and the like.

The active layer 460 is formed of a semiconductor material having an empirical formula of $In_xAl_yGa_{1-x-y}N$ ($0 \leq x \leq 1$, $0 \leq y \leq 1$, $0 \leq x+y \leq 1$). When the active layer 460 is formed in the multiple quantum well (MQW) structure, the active layer 460 is formed by stacking a plurality of well layers and a plurality of barrier layers, for example, at a cycle of InGaN well layer/GaN barrier layer.

The active layer 460 is formed of another material in accordance with the material constituting the first semiconductor layer 440 and the second semiconductor layer 450. In other words, the active layer 460 converts energy by the recombination of electrons and holes into light and emits. Therefore, it is recommended that the active layer 460 be formed of a material having an energy band gap smaller than those of the first semiconductor layer 440 and the second semiconductor layer 450.

The second semiconductor layer 450 is formed by doping a p-type dopant such as Mg, Zn and the like into a semiconductor material having an empirical formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN and InN and the like.

Figure 3B:
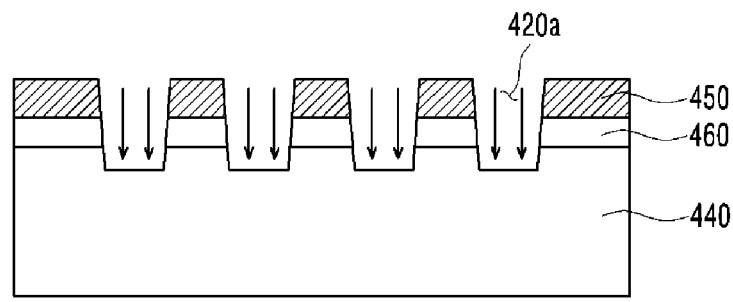

As shown in FIG. 3B, the second semiconductor layer 450, the active layer 460 and the first semiconductor layer 440 are etched (first etching) by using a common exposure process and an etching process, so that at least one first etching hole 420a is formed. Specifically, the second semiconductor layer 450 and the active layer 460 are etched and penetrated, and the first semiconductor layer 440 is etched to a predetermined depth, and then the first etching hole 420a is formed. The first etching hole 420a is formed by using an etching process, for example, ICP-RIE and the like.

Figure 3C:
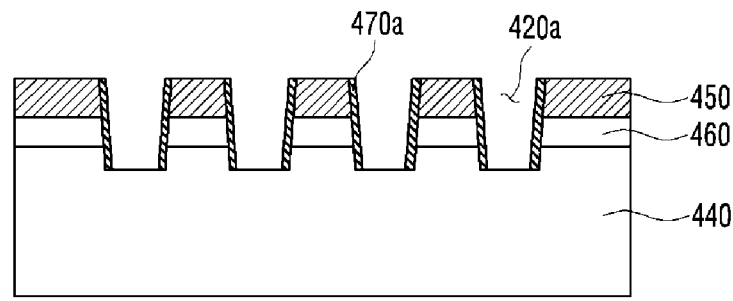

As shown in FIG. 3C, an insulation material is deposited within the first etching hole 420a, and then a first insulation layer 470a is formed on the side wall of the first etching hole 420a. The insulation material of the first insulation layer 470a includes at least one of silicon oxide ($SiO_2$), silicon nitride ($SiO_xN_y$, $Si_xN_y$), metal oxide ($Al_2O_3$) and fluoride based compound.

Figure 3D:
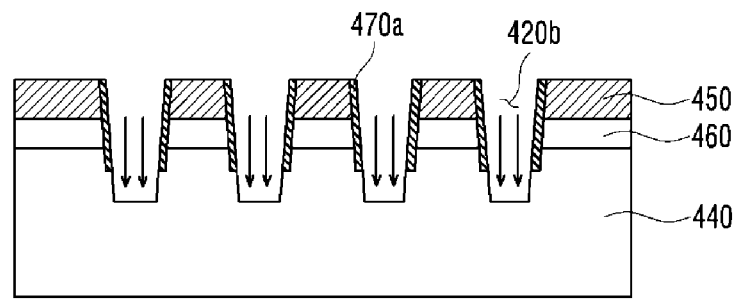

As shown in FIG. 3D, the first semiconductor layer 440 is etched (second etching), so that a second etching hole 420b is formed to have a depth greater than that of the first etching hole 420a. Here, the second etching hole 420b is formed by etching the basal surface of the first etching hole 420a, i.e., a portion of the first semiconductor layer 440. The second etching hole 420b is formed by using an etching process, for example, ICP-RIE and the like.

Figure 3E:
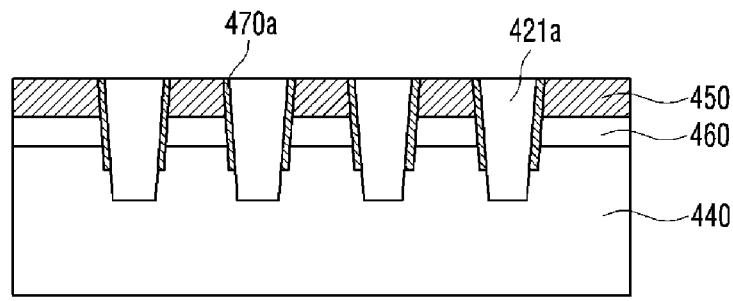

As shown in FIG. 3E, a first conductive via 421a is formed by depositing a conductive material in the second etching hole 420b. Here, the first conductive via 421a corresponds to a portion of a second via hole to be formed through a subsequent process. The conductive material constituting the first via hole 421a includes at least one of Ag, Al, Au, Pt, Ti, Cr and W.

Figure 3F:
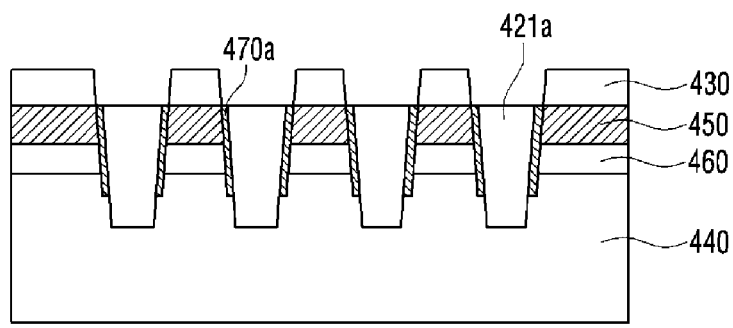

As shown in FIG. 3F, a second conductive layer 430 is formed by depositing a conductive material on the second semiconductor layer 450. Here, the conductive material constituting the second conductive layer 430 includes at least one of Ag, Al, Pt, Ni, Pt, Pd, Au, Ir and a transparent conductive oxide. The transparent conductive oxide includes one of ITO and GZO. Here, the second conductive layer 430 is constituted by the transparent conductive oxide because the electrical contact between the second conductive layer 430 and the second semiconductor layer 450 not only minimizes the contact resistance between the second semiconductor layer 450 and the second conductive layer 430, but also improves light emission efficiency by reflecting outwardly light generated from the active layer 460.

Figure 3G:
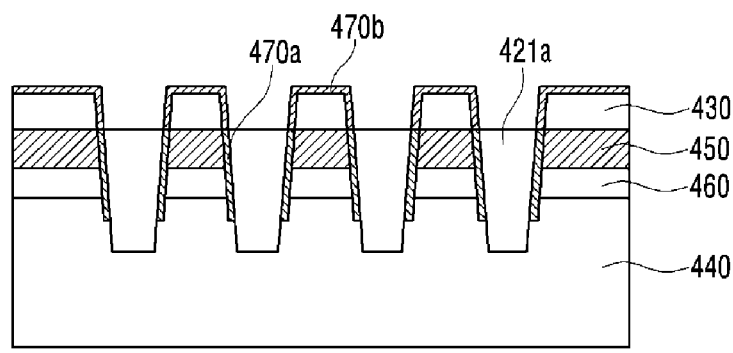

As shown in FIG. 3G, a second insulation layer 470b is formed by depositing an insulation material on the second conductive layer 430. The insulation material of the second insulation layer 470b includes at least one of silicon oxide ($SiO_2$), silicon nitride ($SiO_xN_y$, $Si_xN_y$), metal oxide ($Al_2O_3$) and fluoride based compound.

Figure 3H:
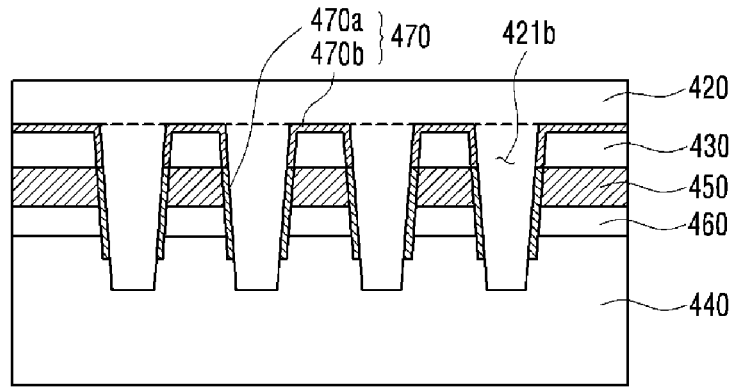

As shown in FIG. 3H, a second conductive via 421b is formed by depositing a conductive material, and then a first conductive layer 420 is formed. The second conductive via 421b corresponds to a structure penetrating through the second conductive layer 430, the second semiconductor layer 450 and the active layer 460, and projects to a certain area of the first semiconductor layer 440.

Figure 3I:
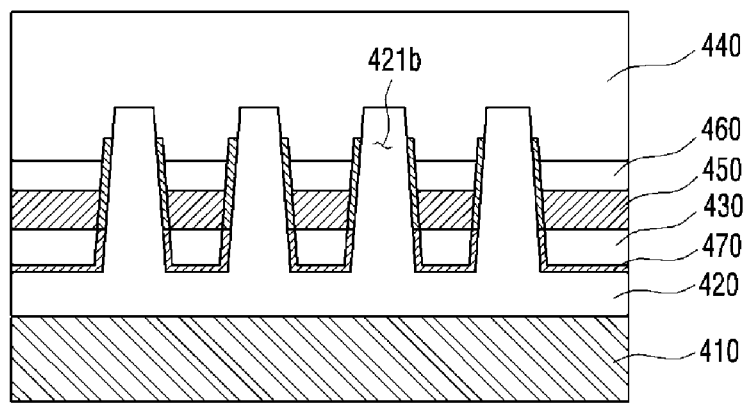

As shown in FIG. 3I, a conductive support member 410 is formed under the first conductive layer 420. The constituent material of the conductive support member 410 includes at least one of Au, Ni, Al, Cu, W, Si, Se and GaAs. For example, the conductive support member 310 is made of a metal alloy of Si and Al. The conductive support member 410 is formed by using a plating method or bonding method in accordance with a material selected from a group consisting of the aforementioned materials.

Figure 3J:
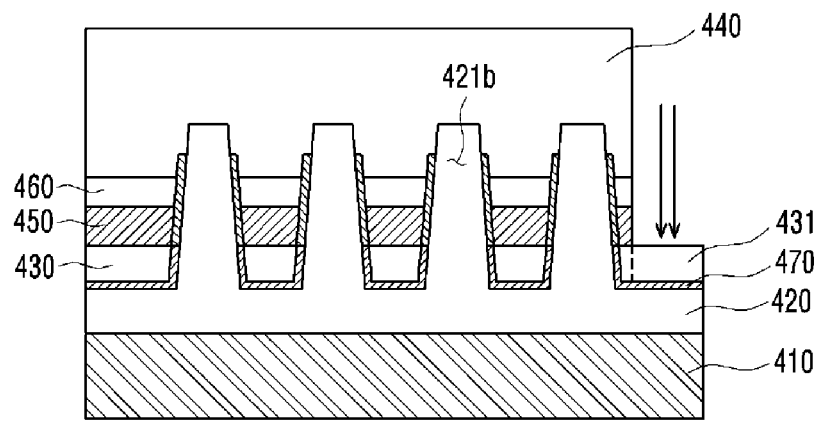

As shown in FIG. 3J, the corner of the light emitting structure is etched. More specifically, the first semiconductor layer 440, the active layer 460 and the second semiconductor layer 450 which are located at the corner of the light emitting structure are etched, and then a portion of the second conductive layer 430 is exposed outward. As a result, an exposed area 431 is formed. The light emitting structure is etched by using ICP-RIE method and the like.

Figure 3K:
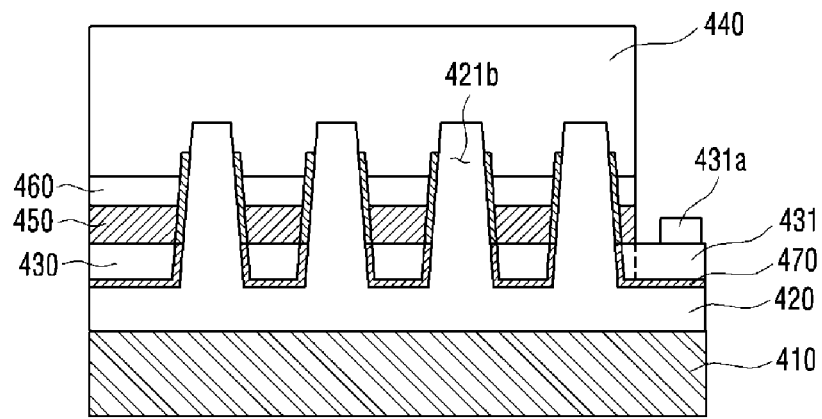

As shown in FIG. 3K, an electrode pad 431a is formed by depositing a conductive material on the exposed area 431 of the second conductive layer 430 or by plating or bonding an electrode material on the exposed area 431.

[Light Emitting Device Package]

Figure 4:
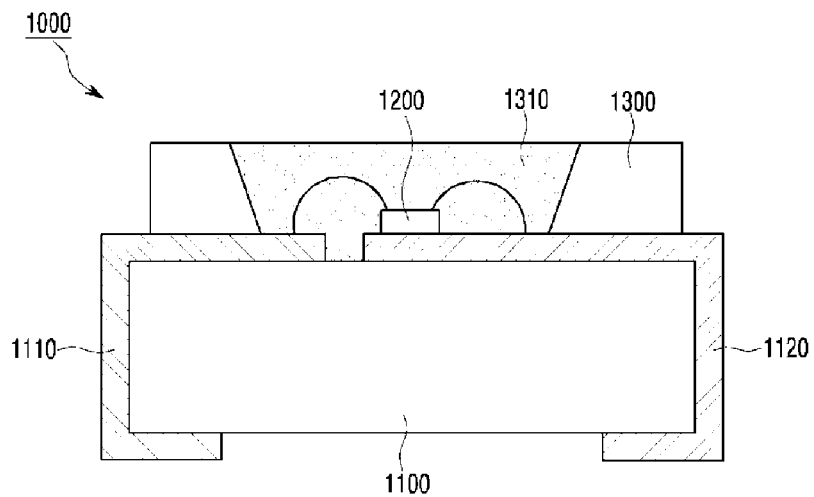
FIG. 4 is a view showing schematically a light emitting device package.

Hereafter, a light emitting device package according to the embodiment will be described with reference to FIG. 4. FIG. 4 shows schematically a light emitting device package 1000.

As shown in FIG. 4, the light emitting device package 1000 according to the embodiment includes a package body 1100, a first electrode layer 1110, a second electrode 1120, a light emitting device 1200 and a filler 1300.

The package body 1100 is formed including a silicon material, a synthetic resin material or a metallic material. The package body 1100 comprises a part 1300. A part 1300 including inclined surfaces are formed around the light emitting device 1200, thereby improving the light-extraction efficiency.

The first electrode layer 1110 and the second electrode 1120 are disposed in the package body 1100. The first electrode layer 1110 and the second electrode 1120 are electrically isolated from each other and supply electric power to the light emitting device 1200. The first electrode layer 1110 and the second electrode 1120 reflect light generated from the light emitting device 1200 and increase luminous efficiency. The first electrode layer 1110 and the second electrode 1120 also exhaust heat generated from the light emitting device 1200.

The light emitting device 1200 is electrically connected to the first electrode layer 1110 and the second electrode 1120. The light emitting device 1200 is disposed on the package body 1100 or is disposed on either the first electrode layer 1110 or the second electrode 1120.

The light emitting device 1200 is also electrically connected to the first electrode layer 1110 and the second electrode 1120 in a wire bonding manner or in a flip-chip manner and in a die-bonding process.

The filler 1310 is formed to surround and protect the light emitting device 1200. The filler 1310 includes a fluorescent material and changes the wavelength of light emitted from the light emitting device 1200.

The light emitting device package 1000 is equipped with one or a plurality of at least one out of the light emitting devices disclosed in the embodiments. There is no limited to the number of the light emitting devices.

A plurality of the light emitting device packages 1000 according to the embodiment are arrayed on the support member. An optical member such as a light guide plate, a prism sheet and a diffusion sheet and the like may be disposed on the optical path of the light emitting device package 1000. Such a light emitting device package 1000, the support member and the optical member are able to function as a light unit.

Another embodiment can be implemented by a display device, a pointing device and a lighting device and the like, all of which include the semiconductor light emitting device or the light emitting device package which has been described in the aforementioned embodiments. For example, the lighting device may include a lamp and a street lamp.

[Backlight Unit (BLU)]

Figure 5:
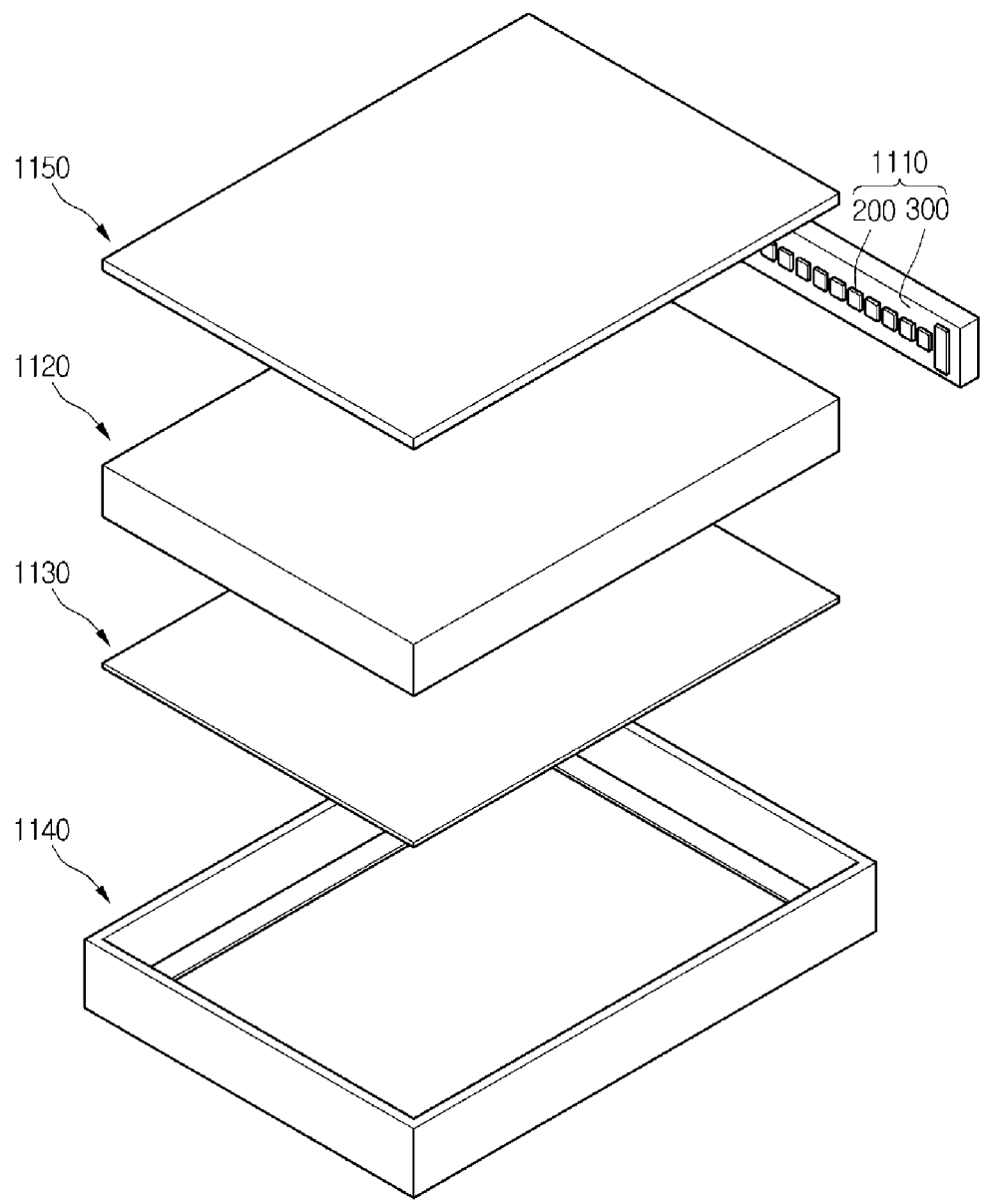
FIG. 5 is a view showing a backlight unit including the light emitting device package according to the embodiment of the present disclosure.

FIG. 5 is a view showing a backlight unit 1100 including light emitting device packages according to an embodiment. The backlight unit 1100 shown in FIG. 5 is an example of lighting systems, and is not limited thereto.

Referring to FIG. 5, the backlight unit 1100 includes a bottom frame 1140, a light guide member 1120 disposed within the bottom frame 1140, and a light emitting module 1110 disposed on at least one lateral surface or the bottom surface of the light guide member 1120. In addition, a reflection sheet 1130 may be disposed under the light guide member 1120.

The bottom frame 1140 has a box shape with an opened topside to accommodate the light guide member 1120, the light emitting module 1110 and the reflection sheet 1130. The bottom frame 1140 is formed of a metallic material or a resin material, but is not limited thereto.

The light emitting module 1110 includes a substrate 300 and a plurality of light emitting device packages 200 of the embodiment. The light emitting device packages is disposed on the substrate. The plurality of light emitting device packages 200 provides light to the light guide member 1120.

As shown in FIG. 5, the light emitting module 1110 is disposed on at least one of inner surfaces of the bottom from 1140. Thus, the light emitting module 1110 provides light toward at least one lateral surface of the light guide member 1120.

Alternatively, the light emitting module 1110 is disposed on the bottom surface of the bottom frame 1140 to provide light toward the bottom surface of the light guide member 1120. This may be variously varied according to the design of the backlight unit. That is, the spirit and scope of the present disclosure is not limited thereto.

The light guide member 1120 is disposed within the bottom frame 1140. The light guide member 1120 receives light from the light emitting module 1110 and guide the light to a display panel (not shown) as surface light.

For example, the light guide member 1120 is a light guide panel (LGP). The LGP is formed of an acryl-based resin such as polymethylmethacrylate (PMMA) or one of polyethylene terephthlate (PET), poly carbonate (PC), cyclic olefin copolymer (COC), and polyethylene naphthalate (PEN).

An optical sheet 1150 is disposed above the light guide member 1120.

For example, the optical sheet 1150 includes at least one of a diffusion sheet, a condensing sheet, a brightness enhancement sheet, and a fluorescence sheet. For example, the optical sheet 1150 is formed by sequentially stacking such a diffusion sheet, a condensing sheet, a brightness enhancement sheet, and a fluorescence sheet. In this case, the diffusion sheet 1150 uniformly diffuses light emitted from the light emitting module 1110, and the diffused light is condensed on the display panel (not shown) by the condensing sheet. Here, light output through the condensing sheet is randomly polarized light. The brightness enhancement sheet enhances polarization of the light output through the condensing sheet. For example, the condensing sheet may be a horizontal and/or vertical prism sheet. Also, the brightness enhancement sheet may be a dual brightness enhancement film. The fluorescence sheet may be a transparent plate or film including a phosphor.

The reflection sheet 1130 is disposed under the light guide member 1120. The reflection sheet 1130 reflects light emitted through the bottom surface of the light guide member 1120 toward a light exit surface of the light guide member 1120.

The reflection sheet 1130 is formed of a resin material having a high reflectivity such as PET, PC, and PVC resins, but is not limited thereto.

[Lighting System]

Figure 6:
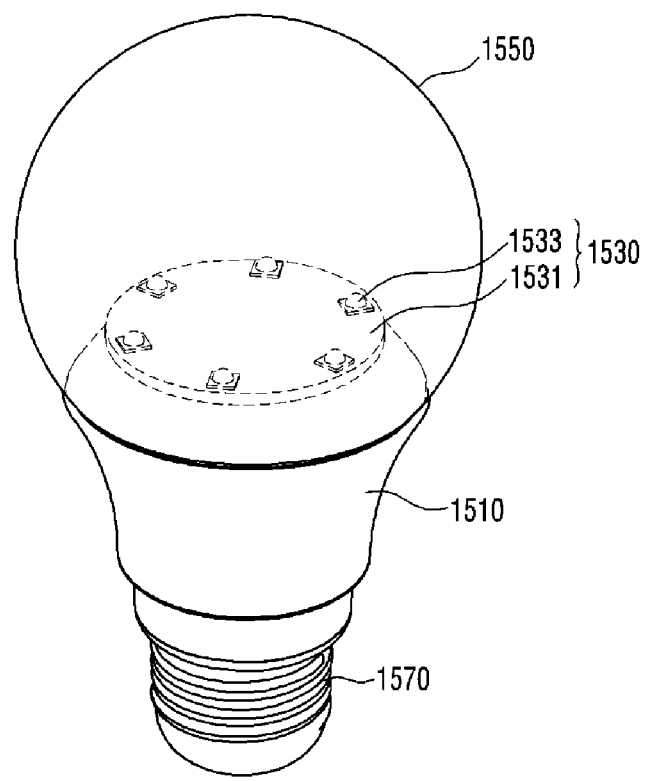
FIG. 6 is a perspective view showing a lighting system 1500 including the light emitting device package shown in FIG. 4.

FIG. 6 is a perspective view showing a lighting system 1500 including the light emitting device package shown in FIG. 4.

Referring to FIG. 6, the lighting system 1500 includes a case 1510, a light emitting module 1530 disposed on the case 1510, a cover 1550 connected to the case 1510, and a connection terminal 1570 connected to the case 1510 and supplied with an electric power from an external power supply.

The case 1510 is formed of a material having an excellent heat radiating characteristic, for example, a metal material or a resin material.

The light emitting module 1530 includes a board 1531 and at least one light emitting device package 1533 which is based on the embodiment and is mounted on the board 1531. The plurality of the light emitting device packages 1533 are radially arranged apart from each other at a predetermined interval on the board 1531.

The board 1531 is an insulating substrate on which a circuit pattern has been printed, and includes, for example, a printed circuit board (PCB), a metal core PCB, a flexible PCB, a ceramic PCB, an FR-4 substrate, etc.

Also, the board 1531 is formed of a material capable of efficiently reflecting light. The surface of the board 1531 may have a color capable of efficiently reflecting light, such as white or silver.

The at least one light emitting device package 1533 is disposed on the board 1531. Each of the light emitting device packages 1533 includes at least one light emitting diode (LED) chip. The LED chip includes both a LED emitting red, green, blue or white light and a UV LED emitting ultraviolet (UV).

The light emitting module 1530 can have various combinations of the light emitting device packages so as to obtain desired color and luminance. For example, the light emitting module 1530 can have a combination of a white LED, a red LED and a green LED in order to obtain a high color rendering index (CRI).

The connection terminal 1570 is electrically connected to the light emitting module 1530 in order to supply power. The connection terminal 1570 is screwed and connected to an external power in the form of a socket. However, there is no limit to the method for connecting the connection terminal 1570 to an external power. For example, the connection terminal 1570 may be made in the form of a pin and inserted into the external power, or may be connected to the external power through a power line.

The features, structures and effects and the like described in the embodiments are included in at least one embodiment of the present disclosure and are not necessarily limited to one embodiment. Furthermore, the features, structures and effects and the like provided in each embodiment can be combined or modified in other embodiments by those skilled in the art to which the embodiments belong. Therefore, the contents related to the combination and modification should be construed to be included in the scope of the present disclosure.

The foregoing embodiments and advantages are merely exemplary and are not to be construed as limiting the present disclosure. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A light emitting device comprising:
a conductive support member;
a first conductive layer disposed on the conductive support member;
a second conductive layer disposed on the first conductive layer;
a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and
an insulation layer comprising a first insulation layer and a second insulation layer,
wherein the first conductive layer comprises:
    a conductive part disposed on the conductive supporting member;
    a first expansion part extending from the conductive part and penetrating through the second conductive layer, the second semiconductor layer and the active layer; and
    a second expansion part extending from the first expansion part and being disposed in the first semiconductor layer,
wherein first expansion part is disposed between the conductive part and second expansion part,
wherein the first insulation layer is disposed on the lateral surface of the first expansion part,
wherein the second insulation layer is disposed between the first conductive layer and the second conductive layer, and
wherein an area of a bottom surface of the second expansion part is greater than an area of a top surface of the first expansion part.

2. The light emitting device of claim 1, wherein a height of the first insulation layer is equal to a height of the first expansion part.

3. The light emitting device of claim 1, wherein the area ratio of the bottom surface of the second expansion part to the top surface of the first expansion part is from 1 to 1.4.

4. The light emitting device of claim 1, wherein the thickness of the first insulation layer is equal to or larger than 200 nm and equal to or less than 1000 nm.

5. The light emitting device of claim 1, wherein at least one of the top surface of the second expansion part and a top surface of the first semiconductor layer has a roughness surface.

6. The light emitting device of claim 1, comprising a passivation layer disposed on the lateral surfaces of the light emitting structure.

7. A light emitting device comprising:
a conductive support member;
a first conductive layer disposed on the conductive support member;
a second conductive layer disposed on the first conductive layer;
a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and
an insulation layer comprising a first insulation layer and a second insulation layer, wherein the first conductive layer comprises:
- a conductive part disposed on the conductive supporting member;
- a first expansion part extending from the conductive part and penetrating through the second conductive layer, the second semiconductor layer and the active layer; and
- a second expansion part extending from the first expansion part and being disposed in the first semiconductor layer, wherein the first insulation layer is disposed on the lateral surface of the first expansion part, wherein the second insulation layer is disposed between the first conductive layer and the second conductive layer, and wherein a width of the second expansion part is greater than a width of the first expansion part.

8. The light emitting device of claim 7, wherein a height of the first insulation layer is equal to a height of the first expansion part.

9. The light emitting device of claim 7, wherein the width of the second expansion part is equal to or less than the sum of the width of the first expansion part and thicknesses of two first insulation layers.

10. The light emitting device of claim 7, wherein the width of the second expansion part is greater than the sum of the width of the first expansion part and the thicknesses of two first insulation layers.

11. The light emitting device of claim 7, wherein the thickness of the first insulation layer is equal to or larger than 200 nm and equal to or less than 1000 nm.

12. The light emitting device of claim 7, wherein at least one of the top surface of the second expansion part and a top surface of the first semiconductor layer has a roughness surface.

13. The light emitting device of claim 7, comprising a passivation layer disposed on the lateral surfaces of the light emitting structure.

14. The light emitting device of claim 7, wherein the second conductive layer comprises one area exposed outward, and further comprising an electrode pad disposed on the exposed area.

15. A light emitting device comprising:
a conductive support member;
a first conductive layer disposed on the conductive support member;
a second conductive layer disposed on the first conductive layer;
a light emitting structure comprising a first semiconductor layer disposed on the second conductive layer, a second semiconductor layer disposed between the first semiconductor layer and the second conductive layer, and an active layer disposed between the first semiconductor layer and the second semiconductor layer; and
an insulation layer comprising a first insulation layer and a second insulation layer,
wherein the first conductive layer comprises:
- a conductive part disposed on the conductive supporting member;
- a first expansion part extending from the conductive part and penetrating through the second conductive layer, the second semiconductor layer and the active layer; and
- a second expansion part extending from the first expansion part and being disposed in the first semiconductor layer, wherein the first insulation layer contacts the first expansion part, the second expansion part and the active layer, and wherein the second insulation layer is disposed between the conductive part and the second conductive layer, wherein the second expansion part comprises a bottom surface and a side surface, wherein the bottom surface of the second expansion part contacts the first insulation layer, and wherein the side surface of the second expansion part contacts the first semiconductor layer.

16. The light emitting device of claim 15, wherein a height of the first insulation layer is equal to a height of the first expansion part.

17. The light emitting device of claim 15, wherein the second expansion part is disposed on the first insulation layer.

18. The light emitting device of claim 15, wherein the thickness of the first insulation layer is equal to or larger than 200 nm and equal to or less than 1000 nm.

19. The light emitting device of claim 15, wherein at least one of the top surface of the second expansion part and a top surface of the first semiconductor layer has a roughness surface.

20. The light emitting device of claim 15, comprising a passivation layer disposed on the lateral surfaces of the light emitting structure.

* * * * *